(12) United States Patent
Hori et al.

(10) Patent No.: US 11,417,634 B2
(45) Date of Patent: Aug. 16, 2022

(54) SEMICONDUCTOR MODULE HAVING AN N TERMINAL, A P TERMINAL AND AN OUTPUT TERMINAL AND METHOD OF FABRICATING THE SEMICONDUCTOR MODULE

(71) Applicant: FUJI ELECTRIC CO., LTD., Kawasaki (JP)

(72) Inventors: Motohito Hori, Kawasaki (JP); Yoshinari Ikeda, Kawasaki (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/033,207

(22) Filed: Sep. 25, 2020

(65) Prior Publication Data

US 2021/0104499 A1 Apr. 8, 2021

(51) Int. Cl.
*H01L 25/07* (2006.01)
*H01L 23/498* (2006.01)
(Continued)

(52) U.S. Cl.
CPC ...... *H01L 25/072* (2013.01); *H01L 23/49833* (2013.01); *H01L 24/14* (2013.01); *H01L 24/16* (2013.01); *H01L 24/29* (2013.01); *H01L 24/32* (2013.01); *H01L 24/73* (2013.01); *H01L 24/83* (2013.01); *H01L 25/50* (2013.01); *H01L 2224/16245* (2013.01);
(Continued)

(58) Field of Classification Search
CPC ......... H01L 24/14; H01L 24/16; H01L 24/29; H01L 24/32; H01L 24/73; H01L 24/83; H01L 23/18; H01L 23/50; H01L 23/49537; H01L 23/49548; H01L 23/49562; H01L 23/49575; H01L 23/49833; H01L 25/18; H01L 25/50; H01L 25/072
USPC ........................................................ 257/565
See application file for complete search history.

(56) References Cited

U.S. PATENT DOCUMENTS 6,255,672 B1  7/2001  Yoshioka et al.
9,226,430 B2 * 12/2015  Kim ................. H01L 23/49833
(Continued)

FOREIGN PATENT DOCUMENTS

JP    H1056131 A      2/1998
JP    2000049281 A    2/2000
(Continued)

*Primary Examiner* — Khiem D Nguyen
(74) *Attorney, Agent, or Firm* — Rabin & Berdo, P.C.

(57) ABSTRACT

A semiconductor module having a first metal wiring board, a second metal wiring board, a third metal wiring board, and a first semiconductor element and a second semiconductor element that each include an emitter electrode and a collector electrode. The second metal wiring board is disposed over a principal surface of the first metal wiring board with an insulation material therebetween. The third metal wiring board has a principal surface thereof facing the first metal wiring board. The first and second semiconductor elements are disposed to face directions opposite to each other. The collector electrodes of the first and second semiconductor elements respectively face the principal surfaces of the first and third metal wiring boards. The emitter electrodes of the first and second semiconductor elements are respectively connected to the principal surfaces of the third and second metal wiring boards.

17 Claims, 8 Drawing Sheets

(51) Int. Cl.
 *H01L 23/00* (2006.01)
 *H01L 25/00* (2006.01)
(52) U.S. Cl.
 CPC ............ *H01L 2224/32245* (2013.01); *H01L 2224/73153* (2013.01); *H01L 2224/8384* (2013.01); *H01L 2924/13055* (2013.01)

(56) References Cited

U.S. PATENT DOCUMENTS

| | | | |
|---|---|---|---|
| 9,530,707 B2 * | 12/2016 | Harada | H01L 23/367 |
| 2004/0245648 A1 * | 12/2004 | Nagasawa | H01L 24/81 |
| | | | 257/772 |
| 2013/0277800 A1 | 10/2013 | Hori et al. | |
| 2015/0243640 A1 * | 8/2015 | Horio | H01L 24/49 |
| | | | 257/701 |
| 2017/0133308 A1 * | 5/2017 | Inaba | H01L 24/32 |
| 2017/0275453 A1 * | 9/2017 | Nakamata | C08G 59/4215 |
| 2018/0166397 A1 * | 6/2018 | Yamada | H01L 24/73 |
| 2018/0301422 A1 * | 10/2018 | Yamauchi | H01L 23/3735 |

FOREIGN PATENT DOCUMENTS

| | | | |
|---|---|---|---|
| JP | 2013077745 A | 4/2013 | |
| JP | 2013222950 A | 10/2013 | |
| JP | 2014107506 A | 6/2014 | |
| JP | 2018182105 A | 11/2018 | |

\* cited by examiner

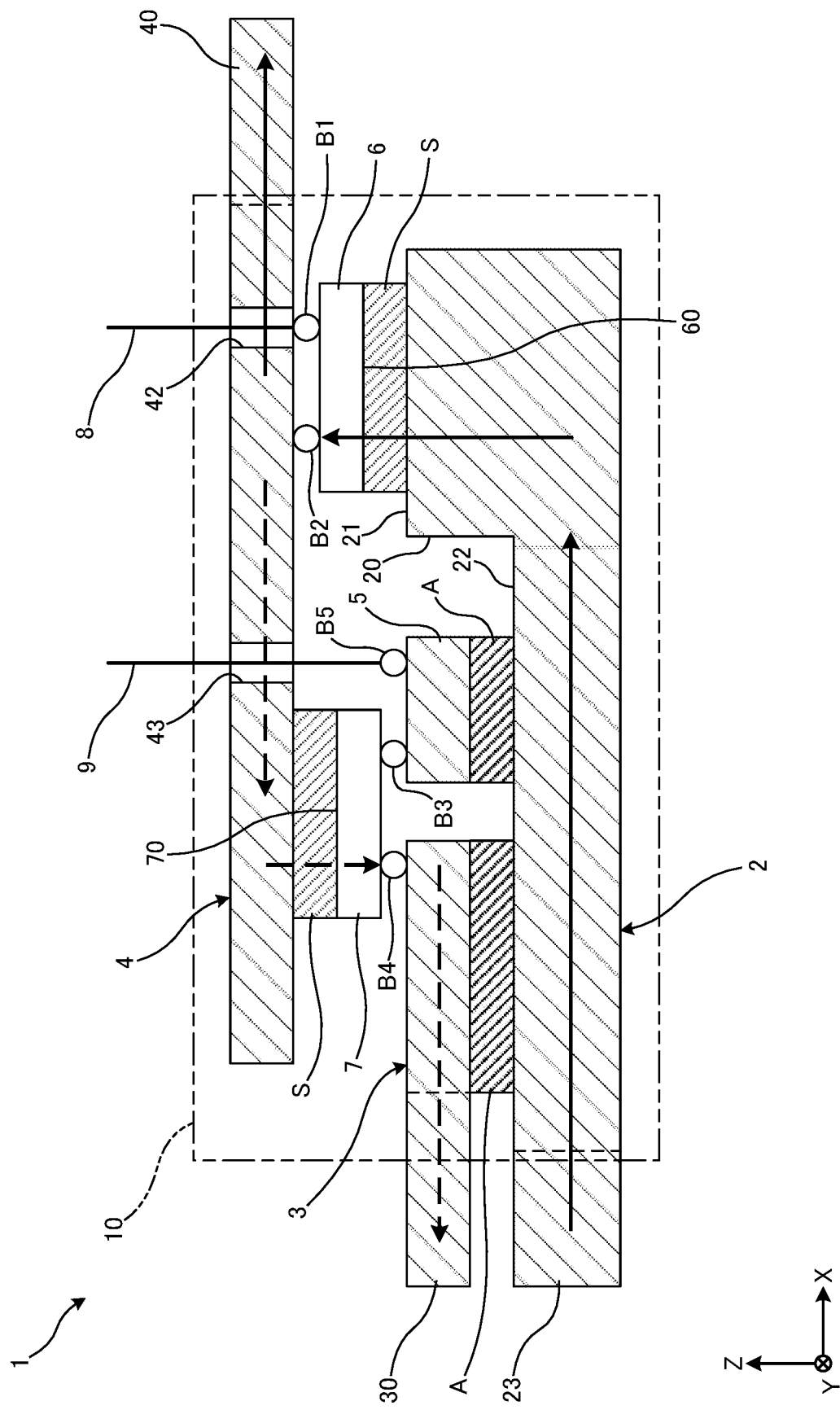

SEMICONDUCTOR MODULE HAVING AN N TERMINAL, A P TERMINAL AND AN OUTPUT TERMINAL AND METHOD OF FABRICATING THE SEMICONDUCTOR MODULE

CROSS REFERENCE TO RELATED APPLICATION

This application is based upon and claims the benefit of priority of the prior Japanese Patent Application No. 2019-181984, filed on Oct. 2, 2019, the entire contents of which are incorporated herein by reference.

TECHNICAL FIELD

The present invention relates to a semiconductor module and a method of fabricating the same.

BACKGROUND ART

A semiconductor apparatus includes a substrate provided with semiconductor elements such as an insulated gate bipolar transistor (IGBT), a power metal oxide semiconductor field effect transistor (power MOSFET), and a free wheeling diode (FWD) and is used for an inverter apparatus or the like.

A typical semiconductor module is formed by disposing a plurality of semiconductor chips over the upper surface of an insulated substrate with a bonding material such as solder therebetween (see, for example, patent documents 1 and 2). Patent document 1 discloses a so-called 2-in-1 module wherein two layered substrates each having a power semiconductor chip disposed thereover are arranged side by side. Patent document 2 discloses a semiconductor module configured such that a plurality of semiconductor chips (IGBT chip, and FWD chip) are arranged side by side over a rectangular insulated substrate.

PRIOR ART DOCUMENTS

Patent Documents

Patent Document 1: Japanese Laid-open Patent Publication No. 2013-222950
Patent Document 2: Japanese Laid-open Patent Publication No. 10-56131

SUMMARY OF THE INVENTION

Problems to be Solved by the Invention

In the meantime, the inventions of patent documents 1 and 2 are each such that a plurality of semiconductor chips are arranged side by side with reference to an insulated substrate, thereby providing long wiring paths, and this could result in large inductance. This could also bring in a problem of an increase in the size of the overall semiconductor module.

The present invention was created in view of such facts, and an object of the invention is to provide a semiconductor module that can have reduced inductance and a miniaturized configuration and a method of fabricating the same.

Means for Solving Problems

A semiconductor module in accordance with an aspect of the present invention includes: a first metal wiring board that forms a P terminal; a second metal wiring board that forms an N terminal; a third metal wiring board that forms an output terminal; a first semiconductor element that includes a collector electrode facing one principal surface of the first metal wiring board; and a second semiconductor element that includes a collector electrode facing one principal surface of the third metal wiring board, wherein the second metal wiring board is disposed over the one principal surface of the first metal wiring board with an insulation material therebetween, the one principal surface of the third metal wiring board faces the first metal wiring board, and the first and second semiconductor elements are disposed to face directions opposite to each other such that an emitter electrode of the first semiconductor element is connected to the one principal surface of the third metal wiring board and an emitter electrode of the second semiconductor element is connected to one principal surface of the second metal wiring board.

A method of fabricating a semiconductor module in accordance with an aspect of the invention implements: a chip disposing step of disposing a first semiconductor element over one principal surface of a first metal wiring board for forming a P terminal in a manner such that a collector electrode of the first semiconductor element faces said principal surface, and disposing a second semiconductor element over one principal surface of a third metal wiring board for forming an output terminal in a manner such that a collector electrode of the second semiconductor element faces said principal surface; a metal-wiring-board disposing step of disposing a second metal wiring board for forming an N terminal over the principal surface of the first metal plate with an insulation material therebetween; and an assembling step of arranging the first and second semiconductor elements to face directions opposite to each other such that an emitter electrode of the first semiconductor element is connected to the one principal surface of the third metal wiring board and an emitter electrode of the second semiconductor element is connected to one principal surface of the second metal wiring board.

Effect of the Invention

The present invention can implement a semiconductor module having reduced inductance and a miniaturized configuration.

BRIEF DESCRIPTION OF THE DRAWINGS

FIG. 8 is a schematic diagram illustrating directions in which currents flow through a semiconductor module in accordance with embodiments.

DESCRIPTION OF EMBODIMENTS

Figure 1A:
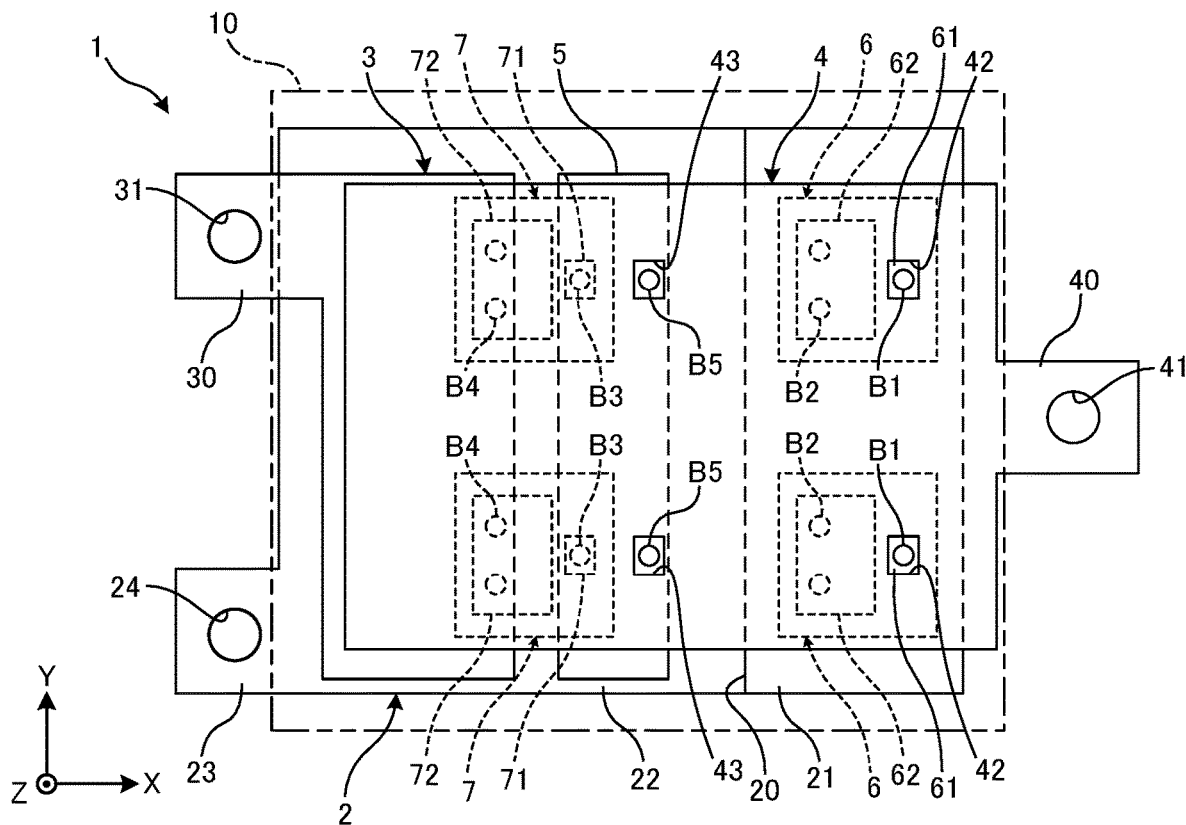
FIG. 1A and FIG. 1B are a schematic diagram of a semiconductor module in accordance with embodiments.
Figure 1B:
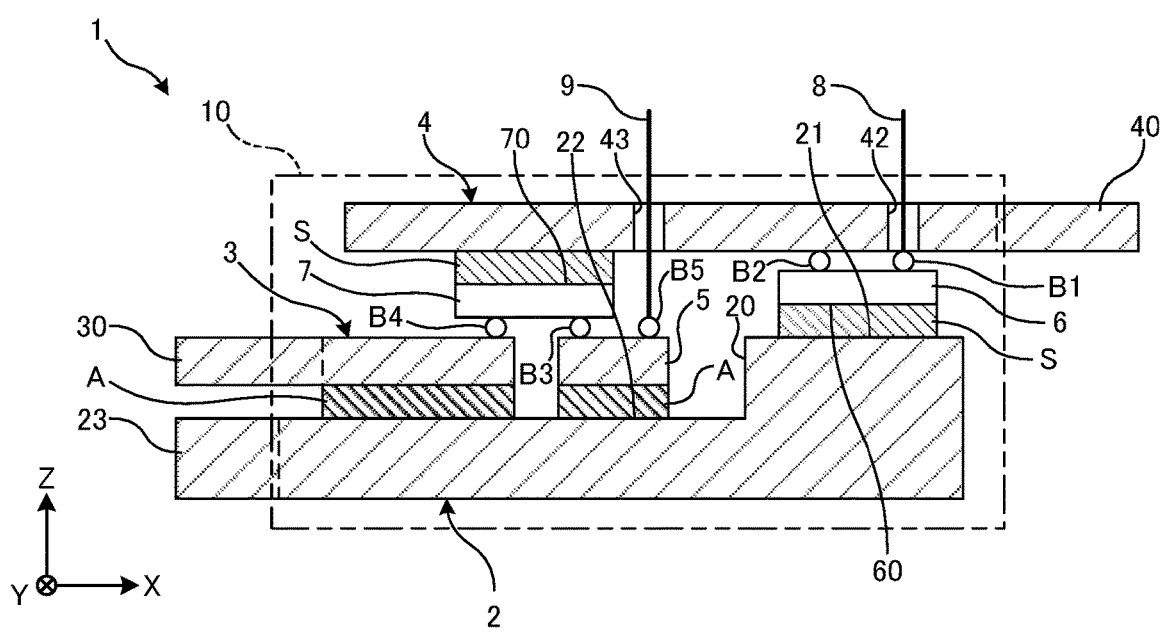

The following describes a semiconductor module to which the present invention can be applied. FIG. 1 is a schematic diagram of a semiconductor module in accordance with embodiments. FIG. 1A is a plan view of a semiconductor module. FIG. 1B is a schematic cross-sectional view of FIG. 1A. The semiconductor module described hereinafter is nothing but an example, and the invention is not limited to this and can have changes made thereto, as appropriate.

In the drawings referred to hereinafter, the longer length direction of the semiconductor module (the direction in which first and second semiconductor elements 6 and 7, both described hereinafter, are arranged) is defined as a X direction, the shorter length direction thereof is defined as a Y direction, and the height direction thereof is defined as a Z direction. The illustrated X, Y, and Z axes are orthogonal to each other and form a right-handed system. Depending on situations, the X direction, the Y direction, and the Z direction may respectively be referred to as a left-right direction, a front-rear direction, and an up-down direction. These directions (front-rear, left-right, and up-down directions) are terms used for descriptive purposes, and the correlations with the X, Y, and Z directions may be changed depending on the orientation of attachment of the semiconductor module. Unless otherwise explicitly indicated, the expression "when seen in a plan view" herein means viewing the upper surface of the semiconductor module from the positive side in the Z direction.

A semiconductor module 1 is applied to, for example, a power conversion apparatus such as a power module. As depicted in FIGS. 1A and 1B, the semiconductor module 1 is configured such that three metal wiring boards are layered and a plurality of semiconductor elements are disposed therebetween to face directions opposite to each other. Specifically, the semiconductor module 1 includes a first metal wiring board 2 that forms a P terminal, a second metal wiring board 3 that forms an N terminal, a third metal wiring board 4 that forms an output terminal, a plurality of first semiconductor elements 6, and a plurality of second semiconductor elements 7.

The first metal wiring board 2, the second metal wiring board 3, and the third metal wiring board 4 are each configured as a plate-shaped body having an upper surface (one principal surface) and a lower surface (another principal surface) and formed from a metal material, e.g., copper material, copper-alloy-based material, aluminum-alloy-based material, iron-alloy-based material. These metal wiring boards are formed in a predetermined shape through, for example, press working. The shapes of the metal wiring boards described hereinafter are nothing examples and can have changes made thereto, as appropriate. These metal wiring boards may also be referred to as lead frames. Note that the upper and lower surfaces of the third metal wiring board 4 in FIG. 1 are opposite to those of the other metal wiring boards with reference to the Z axis, as will be described hereinafter in detail. The surface of the third metal wiring board 4 to which the semiconductor elements are bonded is defined as an upper surface (one principal surface).

The first semiconductor element 6 and the second semiconductor element 7 are shaped like a quadrangle when seen in a plan view and formed from a semiconductor substrate of, for example, silicon (Si), silicon carbide (SiC), or gallium nitride (GaN). The first semiconductor element 6 and the second semiconductor element 7 will preferably be formed from SiC or GaN. Thus, loss can be decreased even in a region with a high frequency. In embodiments, the first semiconductor element 6 and the second semiconductor element 7 are formed from a reverse-conducting/insulated-gate-bipolar-transistor element (RC-IGBT element) which has the functions of both an insulated-gate-bipolar-transistor (IGBT) element and a free-wheeling-diode (FWD) element.

The first semiconductor element 6 and the second semiconductor element 7 are not limited to the above-described configuration and may be formed by combining a switching element such as an IGBT or a power metal oxide semiconductor field effect transistor (power MOSFET) and a diode such as a free wheeling diode (FWD). A reverse blocking-IGBT (RB-IGBT) or the like which has sufficient tolerance to a reverse bias may be used for the first semiconductor element 6 and the second semiconductor element 7. The shape of the first semiconductor element 6 and the second semiconductor element 7, the number of such elements to be installed, and the positions of such elements can be changed, as appropriate.

The first semiconductor element 6 and the second semiconductor element 7 respectively have one surfaces on which collector electrodes 60 and 70 are disposed and other surfaces on which gate electrodes 61 and 71 and emitter electrodes 62 and 72 are disposed. The areas of the emitter electrodes 62 and 72 are larger than those of the gate electrodes 61 and 71. The collector electrodes may be referred to as back-side electrodes, and the gate electrodes 61 and 71 and the emitter electrodes 62 and 72 may be referred to as front-side electrodes. Meanwhile, the collector electrodes and the emitter electrodes 62 and 72 may be referred to as main electrodes, and the gate electrodes 61 and 71 may be referred to as control electrodes. In addition, when the first semiconductor element 6 and the second semiconductor element 7 are MOSFETs, the collector electrodes may be referred to as drain electrodes, and the emitter electrodes 62 and 72 may be referred to as source electrodes. Although the first semiconductor element 6 and the second semiconductor element 7 are assigned different reference marks for descriptive purposes, these elements may be formed from the same switching element.

When seen in a plan view, the first metal wiring board 2 is shaped like a rectangle that is slightly longer in the X direction than in the Y direction. The upper surface (one principal surface) of the first metal wiring board 2 has a step-like shape. In particular, the upper surface of the first metal wiring board 2 is divided into a first principal surface 21 and a second principal surface 22 that are different in height in the Z direction by a riser section 20 extending in the Y direction. The riser section 20 is positioned to the right of the center of the first metal wiring board 2 in the X direction.

The first principal surface 21 is positioned entirely on the right side of the plane of FIG. 1A (positive side in the X direction) and shaped like a long rectangle in the Y direction when seen in a plan view. The second principal surface 22 is located on the left side of the plane of FIG. 1A (negative side in the X direction with reference to the first principal surface 21) and shaped like a slightly long rectangle in the Y direction when seen in a plan view. The second principal surface 22 is provided at a position one step down from the first principal surface 21.

A protruding piece 23 protruding in the X direction is provided at a left corner of the second principal surface 22 (a corner on the negative side in the X direction). The protruding piece 23 has a circular hole 24 extending therethrough in the thickness direction (Z direction). The protruding piece 23 forms a first external connection section for connection to an external conductor (P terminal), as will be described hereinafter in detail.

Two first semiconductor elements 6 are each disposed over the first principal surface 21 with a bonding material S therebetween. The two first semiconductor elements 6 are arranged in the Y direction. Each of the first semiconductor elements 6 includes a collector electrode 60 facing the one principal surface of the first metal wiring board 2 (facing the negative side in the Z direction) and a gate electrode 61 and an emitter electrode 62 facing the positive side in the Z direction. In addition, the gate electrode 61 and the emitter electrode 62 of each of the first semiconductor elements 6 are arranged in the X direction. The gate electrode 61 is located on the positive side in the X direction, and the emitter electrode 62 is located on the negative side in the X direction. A sintered material containing metal nano-particles of silver or the like is used for the bonding material S. The sintered material is formed from a porous metal body of silver or the like through heating. The bonding material S is not limited to silver and may be a sintered material formed from another porous metal body.

The second metal wiring board 3 and a gate metal wiring board 5 are each disposed over the second principal surface 22 with an insulation material A therebetween. When seen in a plan view, the second metal wiring board 3 is shaped like a rectangle that is longer in the Y direction than in the X direction. The width of the second metal wiring board 3 in the Y direction is slightly less than that the width of the first metal wiring board 2 in the Y direction. The second metal wiring board 3 is positioned entirely on the left side of the second principal surface 22.

A protruding piece 30 protruding in the X direction is provided at a left corner of the second metal wiring board 3 (a corner on the negative side in the X direction). As depicted in FIG. 1A, the protruding piece 30 is provided at a position such that this piece does not overlap the protruding piece 23 when seen in a plan view. More specifically, the protruding piece 30 is provided at the corner of the second metal wiring board 3 that is located on the opposite side from the protruding piece 23 in the Y direction. The protruding piece 30 has a circular hole 31 extending therethrough in the thickness direction (Z direction). The protruding piece 30 forms a second external connection section for connection to an external conductor (N terminal), as will be described hereinafter in detail.

The gate metal wiring board 5 is a metal wiring board to connect to the gate electrodes 61 of the second semiconductor elements 7. As with the metal wiring boards described above, the gate metal wiring board 5 is configured as a plate-shaped body having an upper surface (one principal surface) and a lower surface (another principal surface) and formed from a metal material, e.g., copper material, copper-alloy-based material, aluminum-alloy-based material, iron-alloy-based material.

The gate metal wiring board 5 is shaped like a rectangle that is long in the Y direction and located between the second metal wiring board 3 and the riser section 20. The gate metal wiring board 5 is located at a position between the first metal wiring board 2 and the third metal wiring board 4 that corresponds to the gate electrodes 71 of the second semiconductor elements 7, as will be described hereinafter in detail. The Y-direction width and Z-direction thickness of the gate metal wiring board 5 are equal to those of the second metal wiring board 3. The upper surface (one principal surface) of the second metal wiring board 3, the upper surface (one principal surface) of the gate metal wiring board 5, and the first principal surface 21 will preferably be located at the same height.

The insulation material A is formed from an adhesive containing an insulation medium, e.g., epoxy resin, silicone resin, polyimide resin. The insulation material A may be a paste adhesive to be applied to and cured on the second principal surface 22 of the first metal wiring board 2 or a sheet-like adhesive to be laminated over the second principal surface 22.

When seen in a plan view, the third metal wiring board 4 is shaped like a rectangle that is slightly longer in the X direction than in the Y direction. The third metal wiring board 4 is positioned to cover areas above the first metal wiring board 2, the second metal wiring board 3, and the gate metal wiring board 5. As described above, the third metal wiring board 4 includes an upper surface (one principal surface) facing the negative side in the Z direction (facing the principal surface of the first metal wiring board 2 located thereunder) and a lower surface facing the positive side in the Z direction.

A protruding piece 40 protruding in the X direction is provided at a right side-edge portion of the third metal wiring board 4 (a side-edge portion on the positive side in the X direction). As depicted in FIG. 1A, the protruding piece 40 protrudes rightward from the Y-direction center of the right side-edge portion of the third metal wiring board 4. The protruding piece 40 has a circular hole 41 extending therethrough in the thickness direction (Z direction). The protruding piece 40 forms a third external connection section for connection to an external conductor (output terminal), as will be described hereinafter in detail.

Two second semiconductor elements 7 are disposed on the one principal surface of the third metal wiring board 4 with the bonding material S. The two second semiconductor elements 7 are positioned entirely on the negative side in the X direction with reference to the two first semiconductor elements 6 and arranged in the Y direction. Each of the second semiconductor elements 7 includes a collector electrode 70 facing one principal surface of the third metal wiring board 4 (facing the positive side in the Z direction) and a gate electrode 71 and an emitter electrode 72 facing the negative side in the Z direction.

In addition, the gate electrode 71 and the emitter electrode 72 of each of the second semiconductor elements 7 are arranged in the X direction. More specifically, the gate electrode 71 is positioned to face the gate metal wiring board 5, and the emitter electrode 72 is positioned to face the second metal wiring board 3. The first semiconductor elements 6 are positioned on the positive side in the X direction with reference to the second semiconductor elements 7 in a manner such that the gate electrodes 61 and the emitter electrodes 62 face the third metal wiring board 4.

The third metal wiring board 4 includes first through holes 42 associated with the first semiconductor elements 6 and second through holes 43 associated with the second semiconductor elements 7. The first through holes 42 are formed at positions directly above the gate electrodes 61 of the first semiconductor elements 6. Thus, two first through holes 42 are arranged in the Y direction. Two second through holes 43 are located at positions above the gate metal wiring board 5 and lateral to the second semiconductor elements 7 and are arranged in the Y direction in association with the gate electrodes 71.

The first through holes 42 and the second through holes 43 are formed as rectangular holes extending in the thickness direction. The shape of the first through holes 42 and the second through holes 43 is not limited to this and can be changed, as appropriate. The first through holes 42 and the second through holes 43 may have a polygonal shape other than a quadrangular shape, e.g., circular shape, triangular shape. As will be described hereinafter in detail, first gate terminals 8 extending upward from the gate electrodes 61 of the first semiconductor elements 6 toward the third metal wiring board 4 can be inserted into the first through holes 42, and second gate terminals 9 extending upward from the one principal surface of the gate metal wiring board 5 toward the third metal wiring board 4 can be inserted into the second through holes 43. The first gate terminals 8 and the second gate terminals 9 will preferably extend vertically upward. The vertical upward extension allows for reduced gate wire lengths. In this case, the angle of upward extension of the first gate terminals 8 and the second gate terminals 9 will preferably fall within a range from 75° to 105°.

Bumps B1 are disposed on the gate electrodes 61 of the first semiconductor elements 6. Two bumps B2 are arranged in the Y direction on the emitter electrode 62 of each of the first semiconductor elements 6. The emitter electrodes 62 are connected (bonded) to the one principal surface of the third metal wiring board 4 via the bumps B2. One ends of the first gate electrodes 8 extending upward from the gate electrodes 61 toward the third metal wiring board 4 are connected (bonded) to the bumps B1. Other ends of the first gate terminals 8 protrude through the first through holes 42 to the other-principal-surface side of the third metal wiring board 4.

Bumps B3 are disposed on the gate electrodes 71 of the second semiconductor elements 7. Two bumps B4 are arranged in the Y direction on the emitter electrode 72 of each of the second semiconductor elements 7. The gate electrodes 71 are connected (bonded) to the one principal surface of the gate metal wiring board 5 via the bumps B3. The emitter electrodes 72 are connected (bonded) to the one principal surface of the second metal wiring board 3 via the bumps B4.

Bump B5 are disposed on the gate metal wiring board 5 at positions directly below the two second through holes 43. One ends of the second gate electrodes 9 extending upward from the gate metal wiring board 5 toward the third metal wiring board 4 are connected (bonded) to the bumps B5. Other ends of the second gate terminals 9 protrude through the second through holes 43 to the other-principal-surface side of the third metal wiring board 4.

The abovementioned bumps are formed in, for example, a spherical shape from a bonding material such as solder. The bumps are not limited to a spherical shape and may be formed in a pillar shape such as a cylindrical shape. The first gate terminals 8 and the second gate terminals 9 are formed from lead wires having a wire diameter sufficiently smaller than the inner diameter of the first through holes 42 or the second through holes 43. For example, the first gate terminals 8 and the second gate terminals 9 may be formed from a metal wire of copper or the like and have a plated surface. The material for the first gate terminals 8 and the second gate terminals 9 can be changed, as appropriate.

As described above, the first semiconductor element 6 and the second semiconductor element 7 are disposed to face directions opposite to each other. The first semiconductor element 6 forms an upper arm, and the second semiconductor element 7 forms a lower arm, as will be described hereinafter in detail.

The abovementioned configuration is packaged (sealed) by a sealing resin 10. The protruding pieces 23, 30, and 40 are not sealed by the sealing resin 10 but are exposed to the outside. Thus, the sealing resin 10 seals the all of the components excluding the protruding pieces 23, 30, and 40.

In this case, the sealing resin 10 is shaped like a rectangular solid overall and defines the external shape of the semiconductor module 1. In particular, the upper surface of the sealing resin 10 forms one principal surface of the semiconductor module 1, and the lower surface of the sealing resin 10 forms another principal surface of the semiconductor module 1. Side surfaces of the sealing resin 10 form side surfaces of the semiconductor module 1.

The protruding piece 23 (first external connection section) and the protruding piece 30 (second external connection section) extend outward from one side surface of the semiconductor module 1 (a side surface on the negative side in the X direction). The protruding piece 40 (third external connection section) extends outward from another side surface of the semiconductor module 1 (a side surface on the positive side in the X direction).

The first gate terminal 8 and the second gate terminal 9 protrude from the one principal surface of the semiconductor module 1 (upper surface of the sealing resin 10). The protruding first gate terminal 8 and second gate terminal 9 form external connection sections for gates. No terminals protrude from the other principal surface of the semiconductor module 1 (lower surface of the sealing resin 10).

For example, the sealing resin 10 may be transfer-molded. A material obtained by adding a filler of silicon oxide or the like to various synthetic resins such as an epoxy resin can be used for the sealing resin 10. A cooler (not illustrated) may be disposed on the lower surface of the sealing resin 10.

In the meantime, when causing a power semiconductor module to perform a switching operation using a power conversion apparatus, a semiconductor element generates an induced voltage $\Delta V$ expressed as $\Delta V = Ls \times di/dt$. In this formula, Ls indicates the parasitic inductance of a conversion circuit section within the power conversion apparatus. The parasitic inductance is present in an input capacitor, the power semiconductor module, and a wire connecting the input capacitor and the power semiconductor module. di/dt indicates a current changing rate in switching. The semiconductor element has the induced voltage $\Delta V$ applied thereto as a surge voltage in addition to a DC voltage on the circuit. Thus, a rated voltage for the module needs to be determined in consideration of the surge voltage such that the withstand voltage of the semiconductor element is not exceeded.

A typical semiconductor module is formed by disposing a plurality of semiconductor elements over the upper surface of an insulated substrate with a bonding material such as solder therebetween. A surface electrode of the semiconductor element is connected to a copper plate on the insulated substrate by a bonding wire. The plurality of semiconductor elements may be arranged side by side over the insulated substrate. In this case, as the number of semiconductor elements increases, more bonding wires are provided, thereby leading to the likelihood of extending the current paths within the module. Accordingly, there has been a problem of increased parasitic inductance in the module as a result of extended current paths. There has also been another problem that the overall module size increases with the number of semiconductor elements as the semiconductor elements are arranged side by side.

Accordingly, the inventors conceived of the present invention by focusing on the orientation of electrodes of semiconductor elements and a method of routing wires. An essential feature of the present invention is such that a plurality of metal wiring boards are layered in a thickness direction with a plurality of semiconductor elements disposed therebetween in a manner such that the electrode of an upper arm and the electrode of a lower arm face directions opposite to each other.

Specifically, in embodiments, as described above, the three metal wiring boards (first metal wiring board 2, second metal wiring board 3, third metal wiring board 4) are arranged in order from down side, the first semiconductor element 6 is disposed between the first metal wiring board 2 and the third metal wiring board 4, and the second semiconductor element is disposed between the second metal wiring board 3 and the third metal wiring board 4. The first metal wiring board 2 and the second metal wiring board 3 have the insulation material A interposed therebetween, and hence the insulation between these boards is ensured.

The collector electrode 60 of the first semiconductor element 6 faces the first metal wiring board 2, and the collector electrode 70 of the second semiconductor element 7 faces the third metal wiring board 4. In addition, the emitter electrode 62 of the first semiconductor element 6 is connected to the third metal wiring board 4, and the emitter electrode 72 of the second semiconductor element 7 is connected to the second metal wiring board 3. Thus, the surface electrode of the first semiconductor element 6 faces upward, the surface electrode of the second semiconductor element 7 faces downward, and the first semiconductor element 6 and the second semiconductor element 7 are disposed to face directions opposite to each other.

In this configuration, a plurality of semiconductor elements are disposed between the three metal wiring boards layered in the thickness direction, and thus wiring members such as bonding wires are not needed, so that short current paths can be implemented. As a result, the inductance (parasitic inductance) in the module can be reduced. The placing of the three metal wiring boards over each other allows the layout of the semiconductor elements to be implemented using an area equivalent to the area of one metal wiring board, so that the overall module can be miniaturized.

In embodiments, the first gate terminal 8 extends vertically upward from the gate electrode 61 of the first semiconductor element 6 toward the third metal wiring board 4, and the second gate terminal 9 extends vertically upward from the one principal surface of the gate metal wiring board 5 toward the third metal wiring board 4. The first gate terminal 8 is inserted into the first through hole 42, and the second gate terminal 9 is inserted into the second through hole 43.

In this configuration, wires from the control electrodes (gate electrodes 61 and 71) can be led to the outside via simple paths so that short current paths can be implemented. The first gate terminal 8 and the second gate terminal 9 extend vertically upward with reference to the plane direction of the plurality of metal wiring boards (XY plane) and thus do not become parallel to the direction of currents flowing through the metal wiring boards, and hence these gate terminals can be made less susceptible to a magnetic field. As a result, noise generation can be reduced.

The following describes current paths within the module by referring to FIG. 8. FIG. 8 is a schematic diagram illustrating directions in which currents flow through the semiconductor module in accordance with embodiments. In FIG. 8, a current path from the P terminal to the output terminal is indicated using solid arrows and defined as a current path for the upper arm. A current path from the output terminal to the N terminal is indicated using dashed arrows and defined as a current path for the lower arm.

As depicted in FIG. 8, a current connected to the P terminal and entering the protruding piece 23 that forms a portion of the P terminal flows through the first metal wiring board 2 toward the positive side in the X direction (flows rightward) and then flows through the bonding material S to the first semiconductor element 6. The current flows from the collector electrode 60 via the emitter electrode 62 and the bump B2 to the third metal wiring board 4 and further flows from the protruding piece 40 to the outside. The protruding piece 40 is connected to, and forms a portion of, the output terminal.

A current entering the protruding piece 40 flows through the third metal wiring board 4 toward the negative side in the X direction (flows leftward) and then flows through the bonding material S to the second semiconductor element 7. The current flows from the collector electrode 70 via the emitter electrode 72 and the bumps B4 to the second metal wiring board 3 and further flows from the protruding piece 30 to the outside. The protruding piece 30 is connected to, and forms a portion of, the N terminal.

In embodiments, as described above, the direction of current flow in the upper arm is opposite to that in the lower arm. Thus, the electromagnetic field on the upper-arm side and that on the lower-arm side are canceled each other out, so that the effect of reducing inductance can be enhanced.

In embodiments, the gate metal wiring board 5 is located at a position between the first metal wiring board 2 and the third metal wiring board 4 that corresponds to the gate electrodes 71 of the second semiconductor elements 7. The gate metal wiring board 5 is disposed over the one principal surface of the first metal wiring board 2 with the insulation material A therebetween. In addition, the gate electrodes 71 are connected to the one principal surface of the gate metal wiring board 5. In this configuration, wiring structures for the gate electrodes 71 can be simplified so that short wiring paths can be implemented. Insulation is ensured using the insulation material A so that the module can be implemented with a configuration that can be provided at low cost without the need to use an expensive insulated substrate.

In embodiments, the one principal surface of the first metal wiring board 2 includes the first principal surface 21 and the second principal surface 22 provided at a lower position than the first principal surface 21. The first semiconductor element 6 is disposed over the first principal surface. The second metal wiring board 3 and the gate metal wiring board 5 are disposed over the second principal surface. In this configuration, the first principal surface 21 and the second principal surface 22 assume a step-like shape together such that the second semiconductor element 7 can be disposed between the third metal wiring board 4 and the second metal wiring board 3 and gate metal wiring board 5 with the first semiconductor element 6 disposed between the first metal wiring board 2 and the third metal wiring board 4.

In embodiments, the semiconductor elements are bonded to the metal wiring boards with the bonding material S formed from a sintered material so that enhanced thermal conductivity and thus improved heat exhausting property can be attained. The surface electrodes of the semiconductor elements are bonded using bumps, thereby allowing for reduced wire lengths such that the effect of reducing inductance can be enhanced.

In embodiments, an edge portion of the first metal wiring board 2 is provided with the protruding piece 23 as a first external connection section for connection to an external conductor. Similarly, the edge portion of the second metal wiring board 3 on the same side as the protruding piece 23 is provided with the protruding piece 30 as a second external connection section for connection to an external conductor. The protruding pieces 23 and 30 are provided at positions such that these pieces do not overlap each other when seen in a plan view. In this configuration, the protruding pieces 23 and 30 both located on the negative side in the X direction can be positioned to be opposite to each other with a predetermined interval therebetween in the Y direction. Hence, an insulation distance can be enhanced between the protruding pieces 23 and 30.

The following describes a method of fabricating a semiconductor module in accordance with an aspect of embodiments by referring to FIGS. 2-7. FIGS. 2-7 are each a perspective view illustrating an example of a step in a method of fabricating a semiconductor module in accordance with embodiments. The method for fabricating a semiconductor module described hereinafter is nothing but an example, and the invention is not limited to this and can have changes made thereto, as appropriate. In each of FIGS. 2-7, "A" is a plan view for an individual step, and "B" is a schematic cross-sectional view for an individual step.

A method of fabricating a semiconductor module in accordance with embodiments implements a first chip-disposing step of disposing a first semiconductor element 6 over a first metal wiring board 2 (see FIG. 2), a metal-wiring-board disposing step of disposing a second metal wiring board 3 and a gate metal wiring board 5 over the first metal wiring board 2 (see FIG. 3), a first bump-disposing step of disposing bumps on the first semiconductor element 6 (see FIG. 4), a second chip-disposing step of disposing a second semiconductor element 7 over the third metal wiring board 4 (see FIG. 5), a second bump-disposing step of disposing bumps on the second semiconductor element 7 (see FIG. 6), an assembling step of arranging the first semiconductor element 6 and the second semiconductor element 7 to face directions opposite to each other (see FIG. 7), and a sealing step (see FIG. 1). The order in which these steps are performed can be changed, as appropriate, as long as no contradictions arise. Although these steps are described separately in the following, the invention is not limited to this. For example, the first and second chip-disposing steps may be concurrently performed. The first and second bump-disposing steps may also be concurrently performed.

Figure 2A:
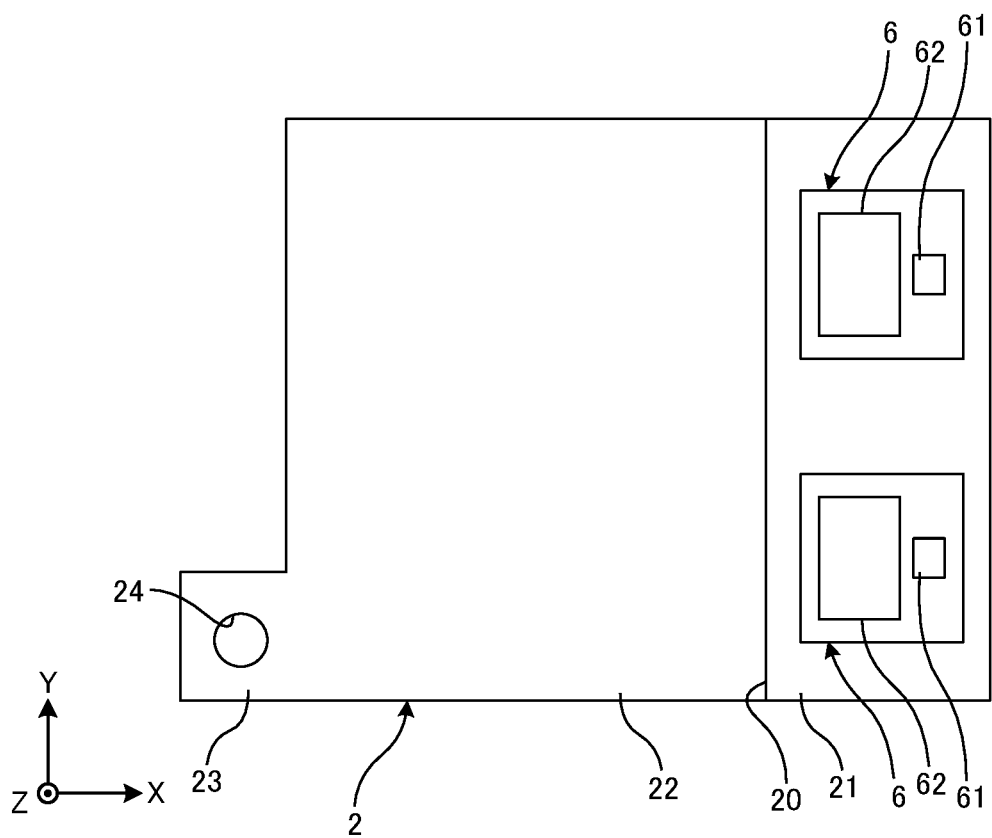
FIG. 2A and FIG. 2B are a schematic diagram illustrating an example of a step in a method of fabricating a semiconductor module in accordance with embodiments.
Figure 2B:
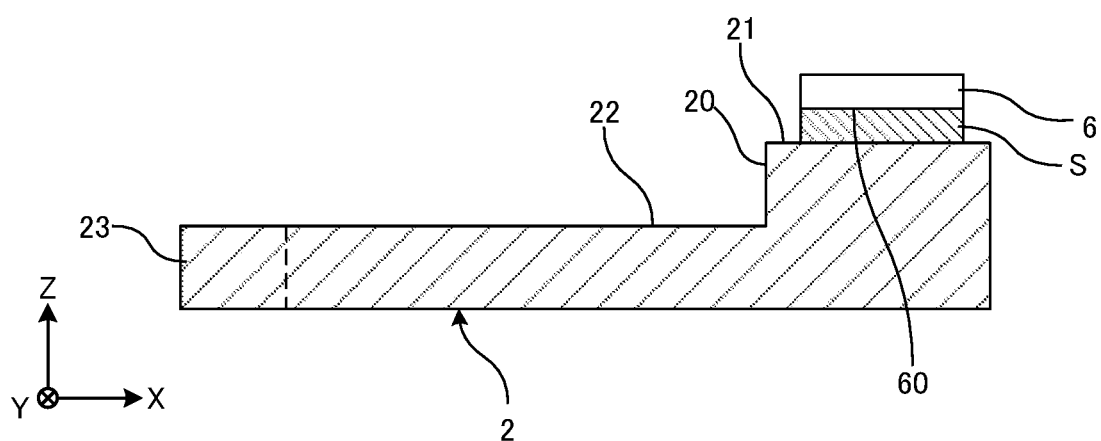

As depicted in FIG. 2, in the first chip-disposing step, the first semiconductor element 6 is disposed such that the collector electrode 60 faces the one principal surface of the first metal wiring board 2 that is to form a P terminal. In particular, the first semiconductor element 6 is disposed over the first principal surface 21 with the bonding material S therebetween in a manner such that the collector electrode 60 faces the first principal surface 21. Thus, the surface electrode of the first semiconductor element 6 faces upward. The bonding material S is a sintered material containing metal nano-particles. For example, the first semiconductor element 6 may be bonded to the first metal wiring board 2 by being pressed toward the first metal wiring board 2 with a pressing force of 5-10 MPa under an environment with an ambient temperature of about 200° C. The sintered material is heated to a sintering temperature and thus becomes a porous metal body of silver or the like to bond the first semiconductor element 6 and the first metal wiring board 2 together.

Figure 3A:
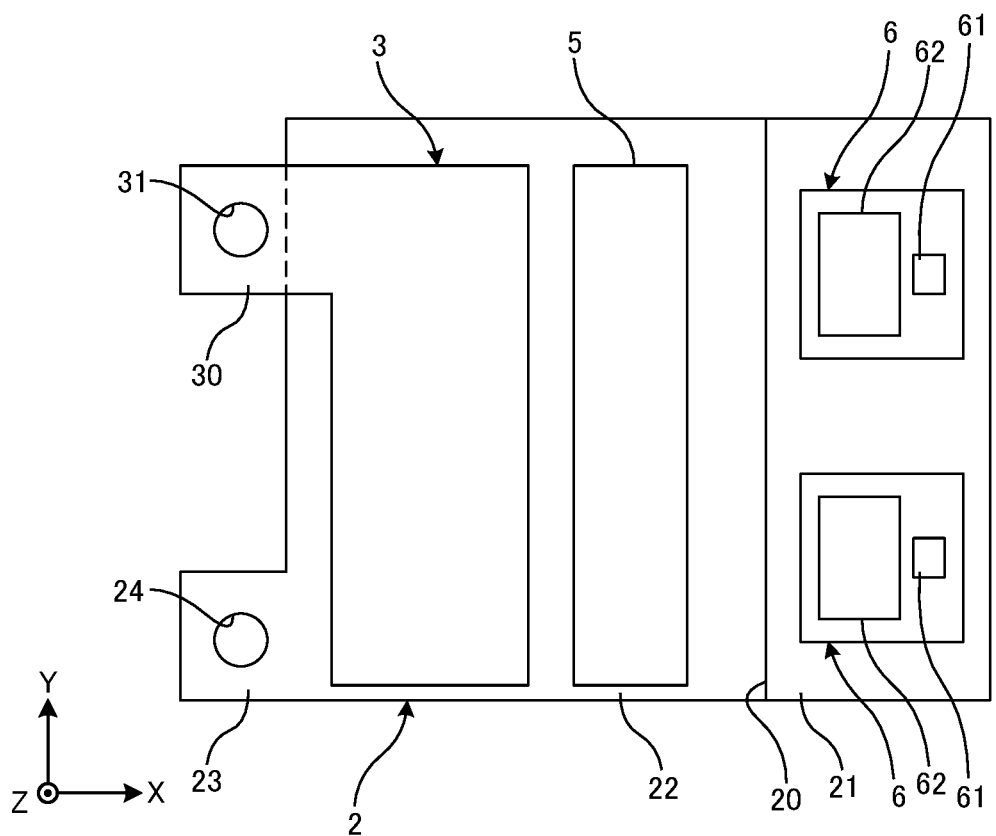
FIG. 3A and FIG. 3B are a schematic diagram illustrating an example of a step in a method of fabricating a semiconductor module in accordance with embodiments.
Figure 3B:
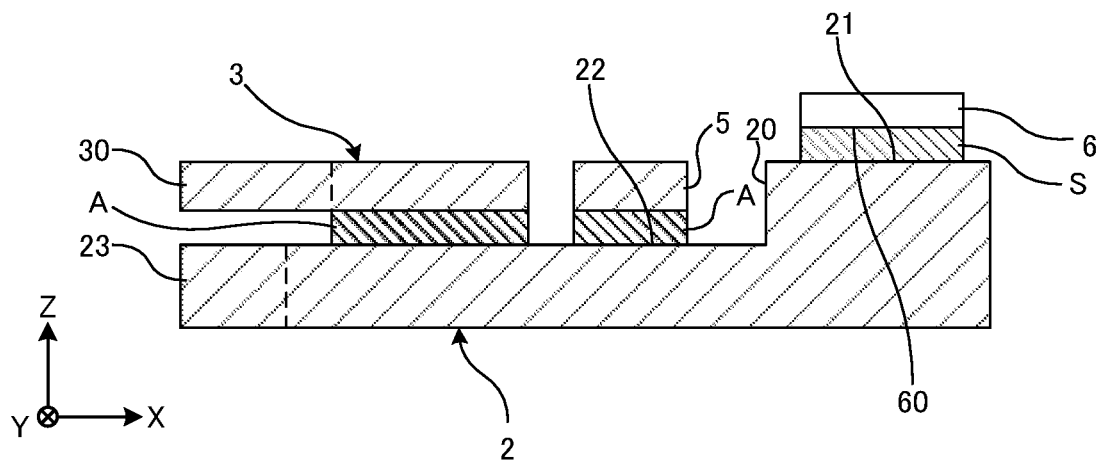

As depicted in FIG. 3, in the metal-wiring-board disposing step, the second metal wiring board 3 that is to form an N terminal and the gate metal wiring board 5 are each disposed over a principal surface of the first metal wiring board 2 with the insulation material A therebetween. In particular, the insulation material A is applied to the second principal surface 22 of the first metal wiring board 2 over which the first semiconductor element 6 has been disposed, and the second metal wiring board 3 and the gate metal wiring board 5 are each disposed on the insulation material A. For example, the second metal wiring board 3 and the gate metal wiring board 5 may adhere to the first metal wiring board 2 by being pressed toward the first metal wiring board 2 with a pressing force of 0-10 MPa under an environment with an ambient temperature of about 200° C. In this case, the insulation material A is not located under the protruding piece 30. Thus, the entirety of the second metal wiring board 3, excluding the protruding piece 30, adheres to the second principal surface by means of the insulation material A. This step allows insulation to be ensured between the first metal wiring board 2 and the second metal wiring board 3 and gate metal wiring board 5. Use of a sintered material as the bonding material S for the first semiconductor element 6 allows the sintered material to be prevented from remelting in this step.

Figure 4A:
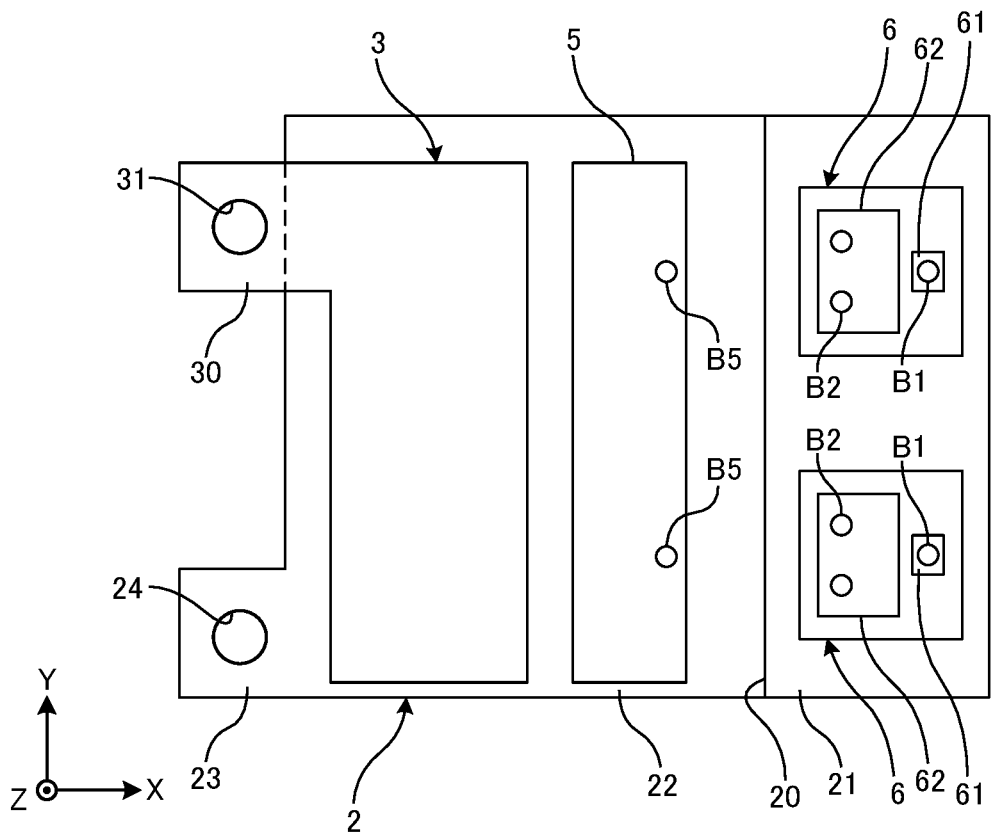
FIG. 4A and FIG. 4B are a schematic diagram illustrating an example of a step in a method of fabricating a semiconductor module in accordance with embodiments.
Figure 4B:
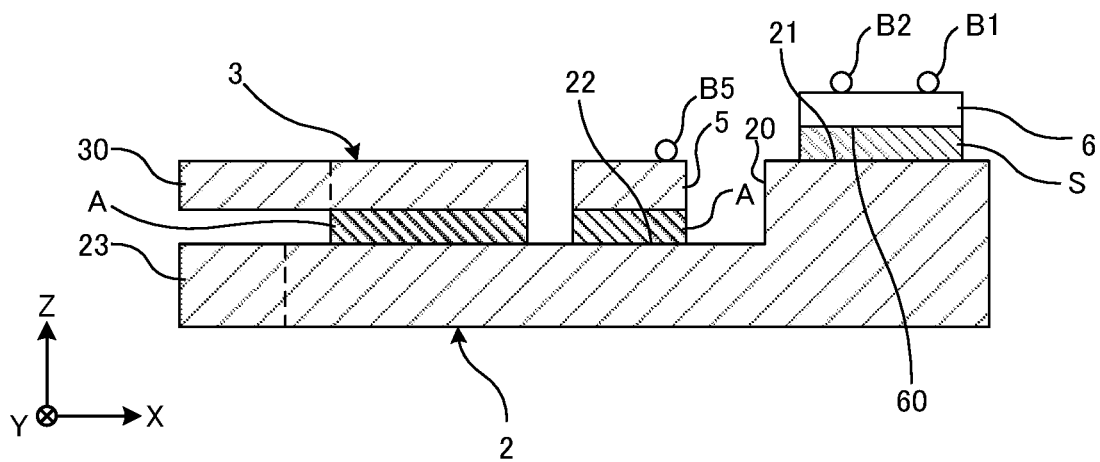

As depicted in FIG. 4, in the first bump-disposing step, spherical bumps are disposed on the first semiconductor element 6 and the gate metal wiring board 5. In particular, a bump B1 is disposed on the gate electrode 61 of the first semiconductor element 6, and a bump B2 is disposed on the emitter electrode 62 thereof. A bump B5 is disposed at a predetermined position on the gate metal wiring board 5. These bumps can be temporarily fixed.

Figure 5A:
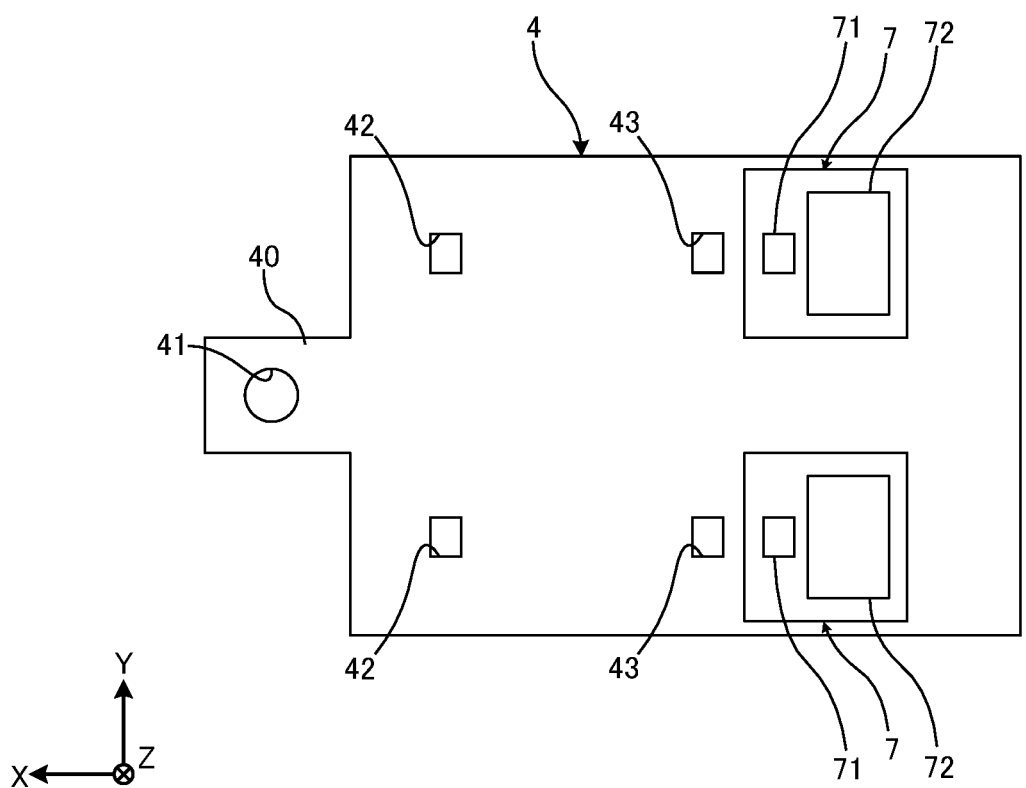
FIG. 5A and FIG. 5B are a schematic diagram illustrating an example of a step in a method of fabricating a semiconductor module in accordance with embodiments.
Figure 5B:
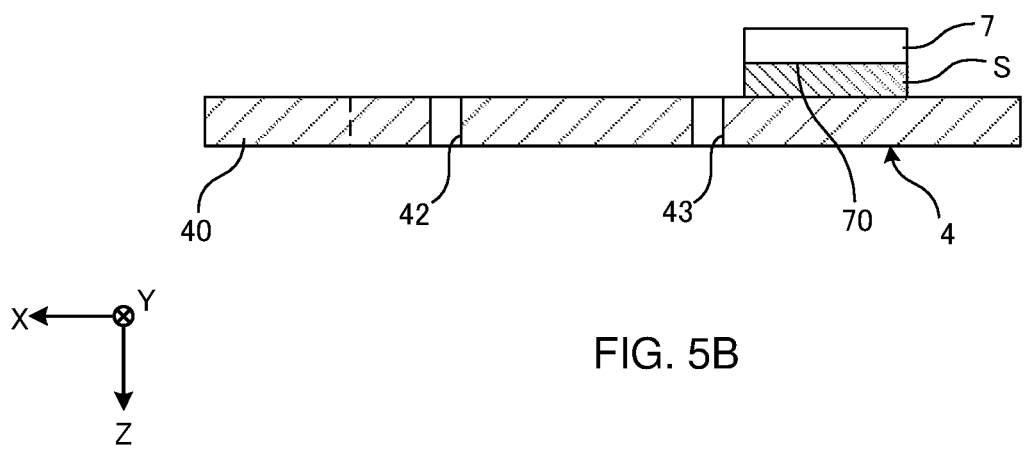

As depicted in FIG. 5, in the second chip-disposing step, the second semiconductor element 7 is disposed such that the collector electrode 70 faces one principal surface of the third metal wiring board 4 that is to form an output terminal. In particular, the second semiconductor element 7 is disposed over the principal surface with the bonding material S therebetween in a manner such that the collector electrode 70 faces the principal surface. Thus, the surface electrode of the second semiconductor element 7 faces upward. Two second semiconductor elements 7 may be arranged in the Y direction at predetermined positions on the negative side in the X direction with reference to second through holes 43. The bonding material S is a sintered material containing metal nano-particles. As in the first chip-disposing step, for example, the second semiconductor element 7 may be bonded to the third metal wiring board 4 by being pressed toward the third metal wiring board 4 with a pressing force of 5-10 MPa under an environment with an ambient temperature of about 200° C. The sintered material is heated to a sintering temperature and thus becomes a porous metal body of silver or the like to bond the second semiconductor element 7 and the third metal wiring board 4 together.

Figure 6A:
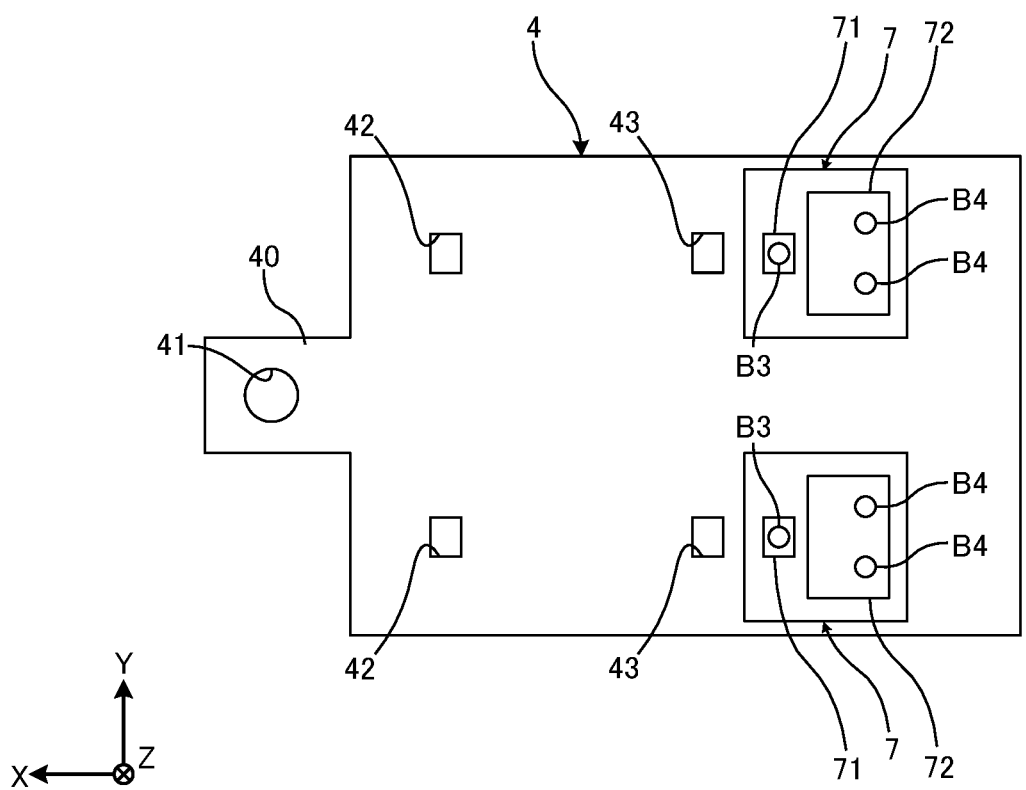
FIG. 6A and FIG. 6B are a schematic diagram illustrating an example of a step in a method of fabricating a semiconductor module in accordance with embodiments.
Figure 6B:
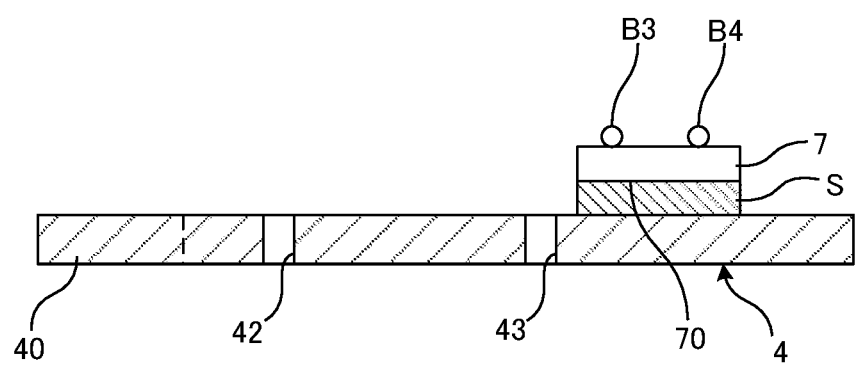

As depicted in FIG. 6, in the second bump-disposing step, spherical bumps are disposed on the second semiconductor element 7. In particular, a bump B3 is disposed on the gate electrode 71 of the second semiconductor element 7, and bumps B4 are disposed on the emitter electrode 72 thereof. These bumps can be temporarily fixed.

Figure 7A:
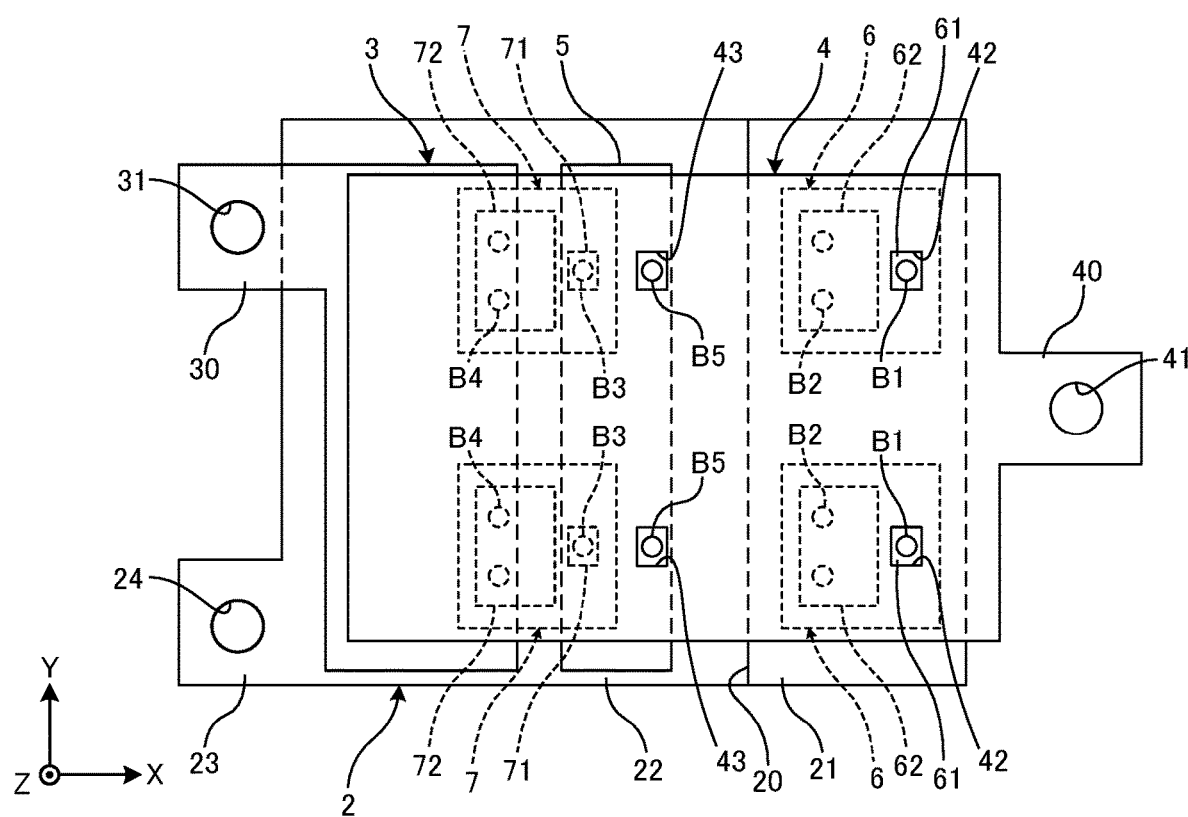
FIG. 7A and FIG. 7B are a schematic diagram illustrating an example of a step in a method of fabricating a semiconductor module in accordance with embodiments.
Figure 7B:
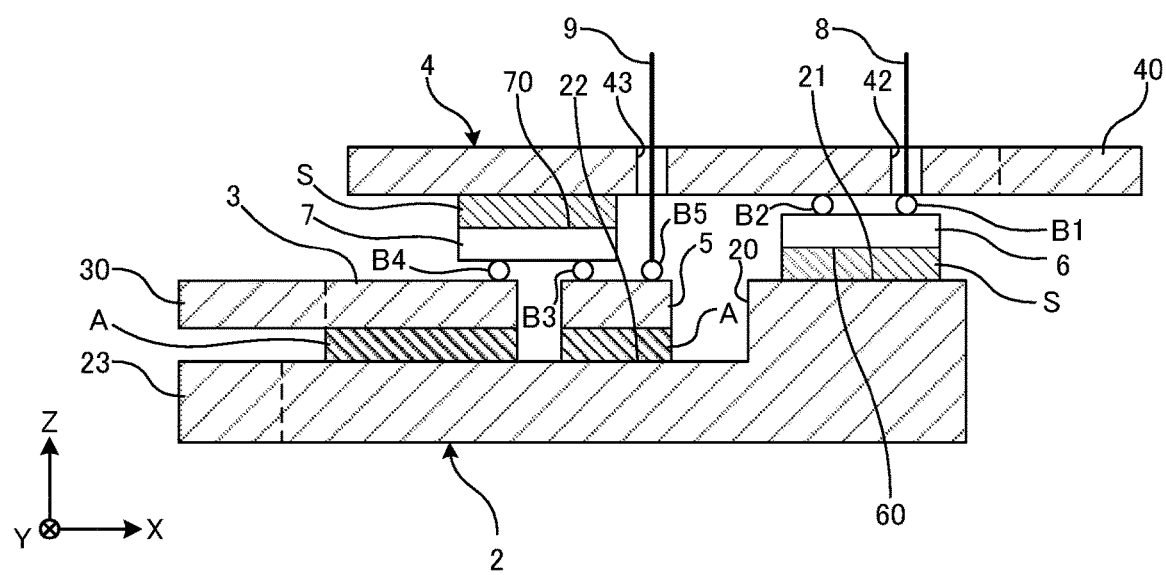

The assembling step is performed after the steps of FIGS. 2-6. As depicted in FIG. 7, in the assembling step, the first semiconductor element 6 and the second semiconductor element 7 after the disposing of the bumps are bonded by being arranged to face directions opposite to each other. In particular, the first metal wiring board 2 and the third metal wiring board 4 are placed over each other to have the first semiconductor element 6 and the second semiconductor element 7 face directions opposite to each other such that the surface electrode of the first semiconductor element 6 faces the third metal wiring board 4 and the surface electrode of the second semiconductor element 7 faces the first metal wiring board 2.

The emitter electrode 62 of the first semiconductor element 6 is connected to the third metal wiring board 4 via the bump B1. The emitter electrode 72 of the second semiconductor element 7 is connected to the second metal wiring board 3 via the bumps B4. The gate electrode 71 of the second semiconductor element 7 is connected to the gate metal wiring board 5 via the bump B3.

The first gate terminal 8 extending in the vertical direction is inserted into the first through hole 42 and has a lower end portion connected to the bump B1. Similarly, the second gate terminal 9 extending in the vertical direction is inserted into the second through hole and has a lower end portion connected to the bump B5. The first gate terminal 8 and the second gate terminal 9 are positioned by a predetermined jig or the like without being in contact with the first through hole 42 or the second through hole 43.

These components are exposed to a reflow furnace at a predetermined temperature to cause the bumps to melt, thereby electrically bonding the chips, the metal wiring boards, and the gate terminals. In this case, the temperature in the reflow furnace will preferably be lower than the ambient temperature in the chip disposing steps described above, so that the sintered material can be prevented from remelting in the reflow process as the solder used for the bumps has a lower melting point than the sintered material.

Next, the sealing step is performed. As depicted in FIG. 1, in the sealing step, the above-described components are packaged (sealed) by the sealing resin 10. The protruding pieces 23, 30, and 40 are not sealed by the sealing resin 10 but are exposed to the outside. Thus, the sealing resin 10 seals all of the components excluding the protruding pieces 23, 30, and 40. For example, the sealing resin 10 may be transfer-molded. The sealing resin is cured to seal the plurality of wiring boards and the plurality of semiconductor elements. In this way, the semiconductor module 1, which includes integrated components, is completed.

In the present invention, as described above, a plurality of metal wiring boards are layered in the thickness direction with a plurality of semiconductor elements disposed therebetween in a manner such that the electrode of an upper arm and the electrode of a lower arm face directions opposite to each other, so that reduced inductance and a miniaturized configuration can be attained.

Embodiments and variations have been described, but other embodiments may be implemented by entirely or partially combining the embodiments and variations described above.

Embodiments are not limited to the above-described embodiments or variations, and various changes, replacements, or modifications may be made without departing from the gist of the technical idea. In addition, as long as the technical idea can be implemented in a different manner owing to technology progress or other derivative technologies, the invention may be implemented using such a method. Accordingly, the claims cover all aspects that can be included in the scope of the technical idea.

The following are an overview of features in the embodiments described above.

A semiconductor module in accordance with the embodiments described above includes: a first metal wiring board that forms a P terminal; a second metal wiring board that forms an N terminal; a third metal wiring board that forms an output terminal; a first semiconductor element that includes a collector electrode facing one principal surface of the first metal wiring board; and a second semiconductor element that includes a collector electrode facing one principal surface of the third metal wiring board, wherein the second metal wiring board is disposed over the one principal surface of the first metal wiring board with an insulation material therebetween, the one principal surface of the third metal wiring board faces the first metal wiring board, and the first and second semiconductor elements are disposed to face directions opposite to each other such that an emitter electrode of the first semiconductor element is connected to the one principal surface of the third metal wiring board and an emitter electrode of the second semiconductor element is connected to one principal surface of the second metal wiring board.

The semiconductor module further includes a first gate terminal that extends upward from a gate electrode of the first semiconductor element toward the third metal wiring board, and the third metal wiring board includes a first through hole into which the first gate terminal is capable of being inserted.

The semiconductor module further includes a gate metal wiring board located at a position between the first and third metal wiring boards that corresponds to a gate electrode of the second semiconductor element, the gate metal wiring board is disposed over the one principal surface of the first metal wiring board with an insulation material therebetween, and the gate electrode of the second semiconductor element is connected to one principal surface of the gate metal wiring board.

The semiconductor module further includes a second gate terminal that extends upward from the one principal surface of the gate metal wiring board toward the third metal wiring board, and the third metal wiring board includes a second through hole into which the second gate terminal is capable of being inserted.

The semiconductor module is configured such that the first and second gate terminals protrude from one principal surface of the semiconductor module.

The semiconductor module is configured such that the one principal surface of the first metal wiring board includes a first principal surface over which the first semiconductor element is disposed and a second principal surface provided at a lower position than the first principal surface, and the second metal wiring board and the gate metal wiring board are disposed over the second principal surface.

The semiconductor module is configured such that the gate metal wiring board is disposed over the second principal surface.

The semiconductor module is configured such that the collector electrode of the first semiconductor element is bonded to the first metal wiring board via a sintered material, and the collector electrode of the second semiconductor element is bonded to the third metal wiring board via a sintered material.

The semiconductor module is configured such that the emitter electrode of the first semiconductor element is bonded to the third metal wiring board via a bump, and the emitter electrode of the second semiconductor element is bonded to the second metal wiring board via a bump.

The semiconductor module is configured such that the first metal wiring board includes an edge portion at which a first external connection section for connection to an external conductor is provided, the second metal wiring board includes an edge portion which is located on a same side as the first external connection section and at which a second external connection section for connection to an external conductor is provided, and the first and second external connection sections extend from one side surface of the semiconductor module and are provided at positions such that the first and second external connection sections do not overlap each other when seen in a plan view.

The semiconductor module is configured such that the third metal wiring board includes an edge portion which is located on an opposite side from the first external connection section and at which a third external connection section for connection to an external conductor is provided, and the third external connection section extends from another side surface of the semiconductor module.

A method of fabricating a semiconductor module in accordance with the embodiments described above implements: a chip disposing step of disposing a first semiconductor element over one principal surface of a first metal wiring board for forming a P terminal in a manner such that a collector electrode of the first semiconductor element faces said principal surface, and disposing a second semiconductor element over one principal surface of a third metal wiring board for forming an output terminal in a manner such that a collector electrode of the second semiconductor element faces said principal surface; a metal-wiring-board disposing step of disposing a second metal wiring board for forming an N terminal over the principal surface of the first metal wiring board with an insulation material therebetween; and an assembling step of arranging the first and second semiconductor elements to face directions opposite to each other such that an emitter electrode of the first semiconductor element is connected to the one principal surface of the third metal wiring board and an emitter electrode of the second semiconductor element is connected to one principal surface of the second metal wiring board.

The method of fabricating a semiconductor module implements, subsequent to the assembling step, a sealing step of sealing the first, second, and third metal wiring boards and the first and second semiconductor elements with a sealing resin.

The method of fabricating a semiconductor module in accordance with the embodiments described above is such that the assembling step implements a bump disposing step of disposing bumps on the emitter electrodes of the first and second semiconductor modules.

The method of fabricating a semiconductor module in accordance with the embodiments described above is such that the third metal wiring board includes a first through hole provided at a position corresponding to a gate electrode of the first semiconductor element and a second through hole provided at a position corresponding to a gate electrode of the second semiconductor element, the assembling step includes inserting, into the first through hole, a first gate terminal extending upward from the gate electrode of the first semiconductor element toward the third metal wiring board and inserting, into the second through hole, a second gate terminal extending upward from one principal surface of a gate metal wiring board toward the third metal wiring board.

The method of fabricating a semiconductor module in accordance with the embodiments described above is such that the chip disposing step includes disposing the first semiconductor element over the first metal wiring board with a sintered material containing metal nano-particles therebetween, disposing the second semiconductor element over the third metal wiring board with a sintered material containing metal nano-particles therebetween, and then heating the sintered materials to a sintering temperature to bond the first semiconductor element to the first metal wiring board and bond the second semiconductor element to the third metal wiring board.

INDUSTRIAL APPLICABILITY

As described above, the present invention has the effect of reducing inductance and implementing a miniaturized configuration and can be useful especially for a semiconductor module and a method of fabricating the same.

EXPLANATION OF THE CODES

1: Semiconductor module
2: First metal wiring board
3: Second metal wiring board
4: Third metal wiring board
5: Gate metal wiring board
6: First semiconductor element
7: Second semiconductor element
8: First gate terminal
9: Second gate terminal
10: Sealing resin
20: Riser section
21: First principal surface
22: Second principal surface
23: Protruding piece (First external connection section)
24: Circular hole
30: Protruding piece (Second external connection section)
31: Circular hole
40: Protruding piece (Third external connection section)
41: Circular hole
42: First through hole
43: Second through hole
60: Collector electrode
61: Gate electrode
62: Emitter electrode
70: Collector electrode
71: Gate electrode
72: Emitter electrode
A: Insulation material
B1: Bump
B2: Bump
B3: Bump
B4: Bump
B5: Bump
S: Bonding material

The invention claimed is:

1. A semiconductor module having an N terminal, a P terminal and an output terminal, comprising:
a first metal wiring board having a principal surface, one end of the first metal wiring board constituting the P terminal, wherein the other end of the first metal wiring board, opposite to the one end constituting the P terminal, has a surface higher than the principal surface of the first metal wiring board, to thereby form a step-like structure at said the other end;

a second metal wiring board having a principal surface and disposed over the principal surface of the first metal wiring board with an insulation material therebetween, one end of the second metal wiring board constituting the N terminal;

a third metal wiring board that has a principal surface facing the first metal wiring board, one end of the third metal wiring board constituting the output terminal;

a first semiconductor element that includes an emitter electrode, and a collector electrode facing the principal surface of the first metal wiring board; and a second semiconductor element that includes an emitter electrode, and a collector electrode facing the principal surface of the third metal wiring board, wherein the first and second semiconductor elements are disposed to face directions opposite to each other, the emitter electrode of the first semiconductor element is connected to the principal surface of the third metal wiring board, and the emitter electrode of the second semiconductor element is connected to the principal surface of the second metal wiring board.

2. The semiconductor module of claim 1, wherein
the collector electrode of the first semiconductor element is bonded to the first metal wiring board via a first sintered material, and
the collector electrode of the second semiconductor element is bonded to the third metal wiring board via a second sintered material.

3. The semiconductor module of claim 1, wherein
the emitter electrode of the first semiconductor element is bonded to the third metal wiring board via a first bump, and
the emitter electrode of the second semiconductor element is bonded to the second metal wiring board via a second bump.

4. The semiconductor module of claim 1, wherein
the first metal wiring board includes an edge portion, and a first external connection section formed at the edge portion thereof for connection to an first external conductor,
the second metal wiring board includes an edge portion, and a second external connection section formed at the edge portion thereof for connection to a second external conductor, the edge portion of the second metal wiring board and the first external connection section being formed at a same side of the semiconductor module, and
the first and second external connection sections extend from a side surface of the semiconductor module and are provided at positions such that the first and second external connection sections do not overlap each other in a plan view of the semiconductor module.

5. The semiconductor module of claim 4, wherein
the third metal wiring board includes an edge portion, and a third external connection section formed at the edge portion thereof for connection to a third external conductor,
the edge portion of the third metal wiring board and the first external connection section are formed at opposite sides of the semiconductor module, and
the third external connection section extends from another side surface of the semiconductor module.

6. The semiconductor module of claim 1, wherein
the first and second metal wiring boards are fully separated and insulated from each other, by the insulation material and a sealing resin sandwiched therebetween.

7. A semiconductor module having an N terminal, a P terminal and an output terminal, comprising:

a first metal wiring board having a principal surface, the first metal wiring board forming the P terminal;

a second metal wiring board having a principal surface and disposed over the principal surface of the first metal wiring board with an insulation material therebetween, the second metal wiring board forming the N terminal;

a third metal wiring board that has a principal surface facing the first metal wiring board, the third metal wiring board forming the output terminal;

a first semiconductor element that includes an emitter electrode, and a collector electrode facing the principal surface of the first metal wiring board; and a second semiconductor element that includes an emitter electrode, and a collector electrode facing the principal surface of the third metal wiring board, wherein the first and second semiconductor elements are disposed to face directions opposite to each other, the emitter electrode of the first semiconductor element is connected to the principal surface of the third metal wiring board, the emitter electrode of the second semiconductor element is connected to the principal surface of the second metal wiring board, the first semiconductor element further includes a gate electrode, the third metal wiring board has a first through hole formed therein, and the semiconductor module further includes a first gate terminal that extends upward from the gate electrode of the first semiconductor element toward the third metal wiring board, and passes through the first through hole.

8. The semiconductor module of claim 7, wherein
the second semiconductor element further includes a gate electrode,
the semiconductor module further includes a gate metal wiring board having a principal surface, the gate metal wiring board being disposed between the first and third metal wiring boards, at a location that corresponds to the gate electrode of the second semiconductor element, and over the principal surface of the first metal wiring board with another insulation material therebetween, and
the gate electrode of the second semiconductor element is connected to the principal surface of the gate metal wiring board.

9. The semiconductor module of claim 8, wherein
the third metal wiring board has a second through hole formed therein, and
the semiconductor module further includes a second gate terminal that extends upward from the principal surface of the gate metal wiring board toward the third metal wiring board, and passes through the second through hole.

10. The semiconductor module of claim 9, wherein
the first and second gate terminals protrude from one principal surface of the semiconductor module.

11. The semiconductor module of claim 8, wherein
the gate metal wiring board is disposed over the second principal surface.

12. A method of fabricating a semiconductor module having an N terminal, a P terminal and an output terminal, the method comprising:

providing a first metal wiring board, a second metal wiring board and a third metal wiring board, each having a principal surface;

a chip disposing step of disposing a first semiconductor element, having an emitter electrode and a collector electrode, over the principal surface of the first metal wiring board, the collector electrode thereof facing the principal surface of the first metal wiring board, and disposing a second semiconductor element, having an emitter electrode and a collector electrode, over the principal surface of the third metal wiring board, the collector electrode thereof facing the principal surface of the third metal wiring board, the first and second semiconductor elements facing directions opposite to each other;

a metal-wiring-board disposing step of disposing the second metal wiring board over the principal surface of the first metal wiring board with an insulation material therebetween; and an assembling step of connecting the emitter electrode of the first semiconductor element to the principal surface of the third metal wiring board, and connecting the emitter electrode of the second semiconductor element to the principal surface of the second metal wiring board, such that one end of the first metal wiring board, one end of the second metal wiring board and one end of the third metal wiring board respectively constitute the P terminal, the N terminal and the output terminal, wherein providing the first metal wiring board includes providing the first metal wiring board of which the other end, opposite to the one end constituting the P terminal, has a surface higher than the principal surface of the first metal wiring board, to thereby have a step-like structure at said the other end.

13. The method of fabricating a semiconductor module of claim 12, further comprising:

subsequent to the assembling step, a sealing step of sealing the first, second, and third metal wiring boards and the first and second semiconductor elements with a sealing resin.

14. The method of fabricating a semiconductor module of claim 12, wherein the assembling step includes a bump disposing step of disposing bumps on the emitter electrodes of the first and second semiconductor elements.

15. The method of fabricating a semiconductor module of claim 12, wherein each of the first and second semiconductor elements further includes a gate electrode;

the third metal wiring board includes a first through hole and a second through hole;

the chip disposing step includes disposing the first and second semiconductor elements such that the gate electrodes thereof respectively are at positions corresponding to the first and second through holes; and the assembling step further includes disposing a gate metal wiring board having a principal surface, disposing a first gate terminal extending upward from the gate electrode of the first semiconductor element toward the third metal wiring board and through the first through hole, and disposing a second gate terminal extending upward from the principal surface of the gate metal wiring board toward the third metal wiring board and through the second through hole.

16. The method of fabricating a semiconductor module claim 12, wherein the chip disposing step includes disposing the first semiconductor element over the first metal wiring board with a first sintered material containing metal nano-particles therebetween, disposing the second semiconductor element over the third metal wiring board with a second sintered material containing metal nano-particles therebetween, and heating the first and second sintered materials to a sintering temperature to bond the first semiconductor element to the first metal wiring board and bond the second semiconductor element to the third metal wiring board.

17. The method of fabricating a semiconductor module claim 13, wherein the first and second metal wiring boards are fully separated and insulated from each other, by the insulation material and the sealing resin sandwiched therebetween.

* * * * *

UNITED STATES PATENT AND TRADEMARK OFFICE
CERTIFICATE OF CORRECTION

| | |
|---|---|
| PATENT NO. | : 11,417,634 B2 |
| APPLICATION NO. | : 17/033207 |
| DATED | : August 16, 2022 |
| INVENTOR(S) | : Motohito Hori and Yoshinari Ikeda |

It is certified that error appears in the above-identified patent and that said Letters Patent is hereby corrected as shown below:

On the Title Page

Item (30) Foreign Application Priority Data
Please add the following:
--October 2, 2019 (JP) ............... JP2019-181984--

Signed and Sealed this
Eighth Day of November, 2022

*Katherine Kelly Vidal*
Katherine Kelly Vidal
*Director of the United States Patent and Trademark Office*